United States Patent
Popp et al.

(10) Patent No.: US 6,821,863 B2
(45) Date of Patent: Nov. 23, 2004

(54) METHOD FOR PRODUCING A CAVITY IN A MONOCRYSTALLINE SILICON SUBSTRATE AND A SEMICONDUCTOR COMPONENT HAVING A CAVITY IN A MONOCRYSTALLINE SILICON SUBSTRATE WITH AN EPITAXIAL COVERING LAYER

(75) Inventors: Martin Popp, Dresden (DE); Dietmar Temmler, Dresden (DE); Kristin Schupke, Dresden (DE); Uwe Schilling, Dresden (DE); Kerstin Pomplun, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/348,150

(22) Filed: Jan. 21, 2003

(65) Prior Publication Data
US 2003/0136994 A1 Jul. 24, 2003

(30) Foreign Application Priority Data
Jan. 21, 2002 (DE) .......................................... 102 02 140

(51) Int. Cl.$^7$ ............................................... H01L 21/76
(52) U.S. Cl. ........................ 438/400; 438/386; 438/425

(58) Field of Search ................................. 438/386, 400, 438/425, 243

(56) References Cited

U.S. PATENT DOCUMENTS

| | | | | |
|---|---|---|---|---|
| 6,156,606 A | * | 12/2000 | Michaelis | 438/243 |
| 6,200,873 B1 | * | 3/2001 | Schrems et al. | 438/386 |
| 6,258,692 B1 | * | 7/2001 | Chu et al. | 438/400 |
| 6,372,604 B1 | * | 4/2002 | Sakai et al. | 438/425 |

* cited by examiner

Primary Examiner—David Nelms
Assistant Examiner—Dao H. Nguyen
(74) Attorney, Agent, or Firm—Laurence A. Greenberg; Werner H. Stemer; Gregory L. Mayback

(57) ABSTRACT

A semiconductor component has a cavity formed in a monocrystalline silicon substrate. The wall of the cavity is covered by a cover layer, at least in an upper collar region, and a covering layer is then applied to the surface of the silicon substrate using a selective epitaxial growth method. The cavity is thereby covered in the process. The method is physically simple and can be carried out cost-effectively. In particular, the described method can be used in order to cover a trench prior to high-temperature processes during the production of a DRAM memory, and to open the trench once again after the high-temperature processes, in order to provide a trench capacitor.

11 Claims, 3 Drawing Sheets

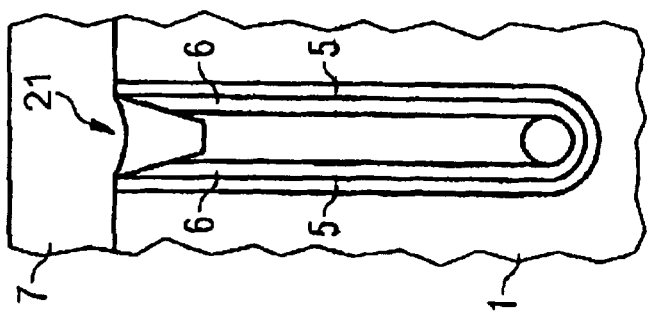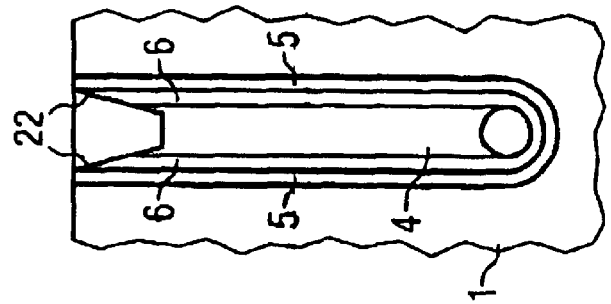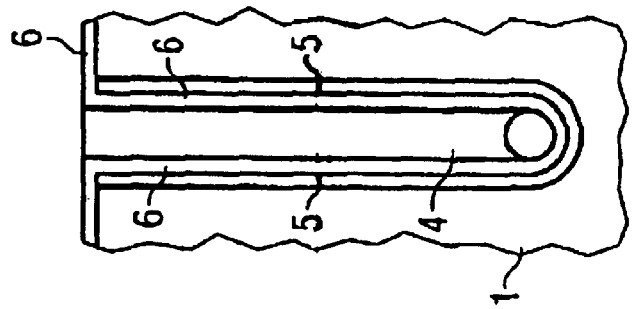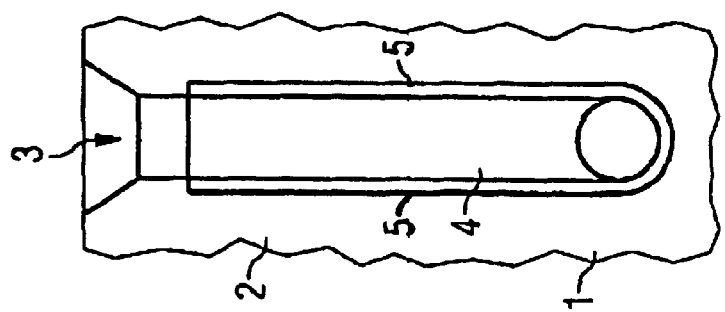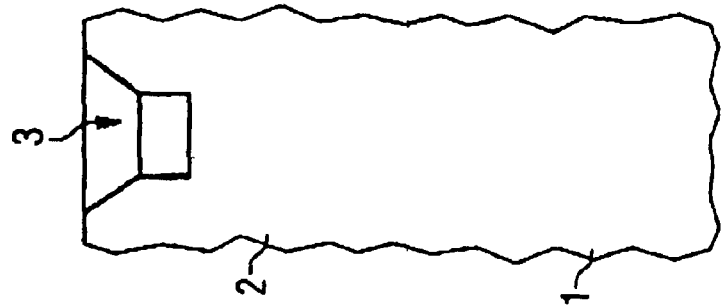

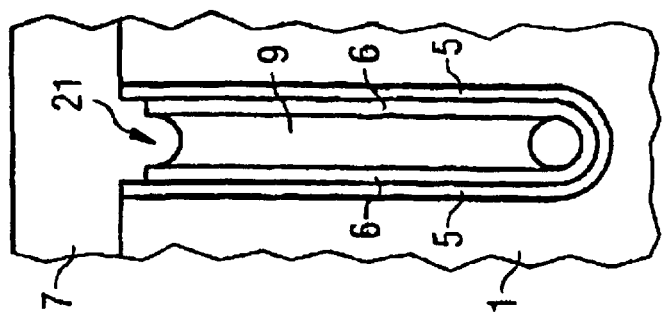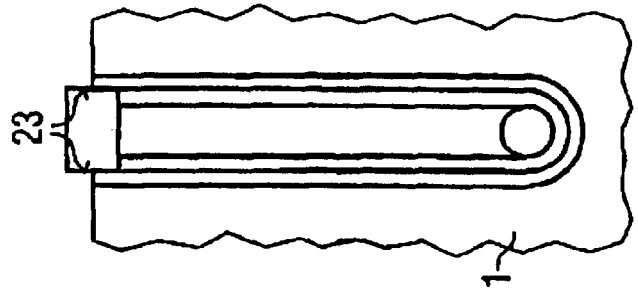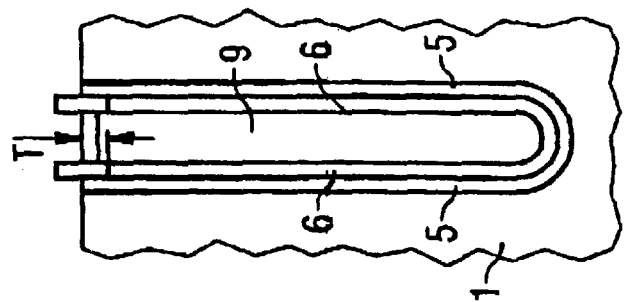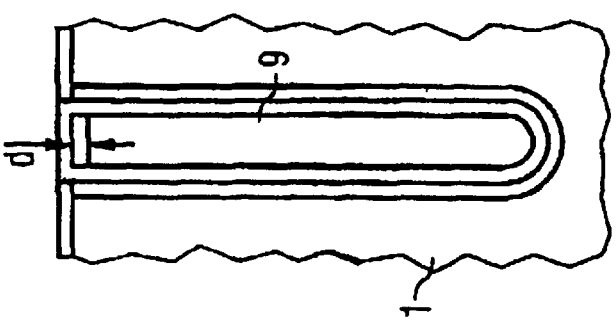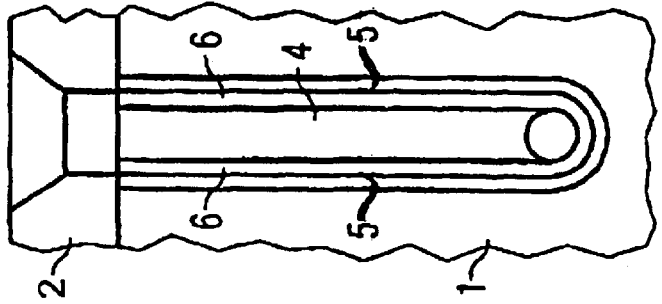

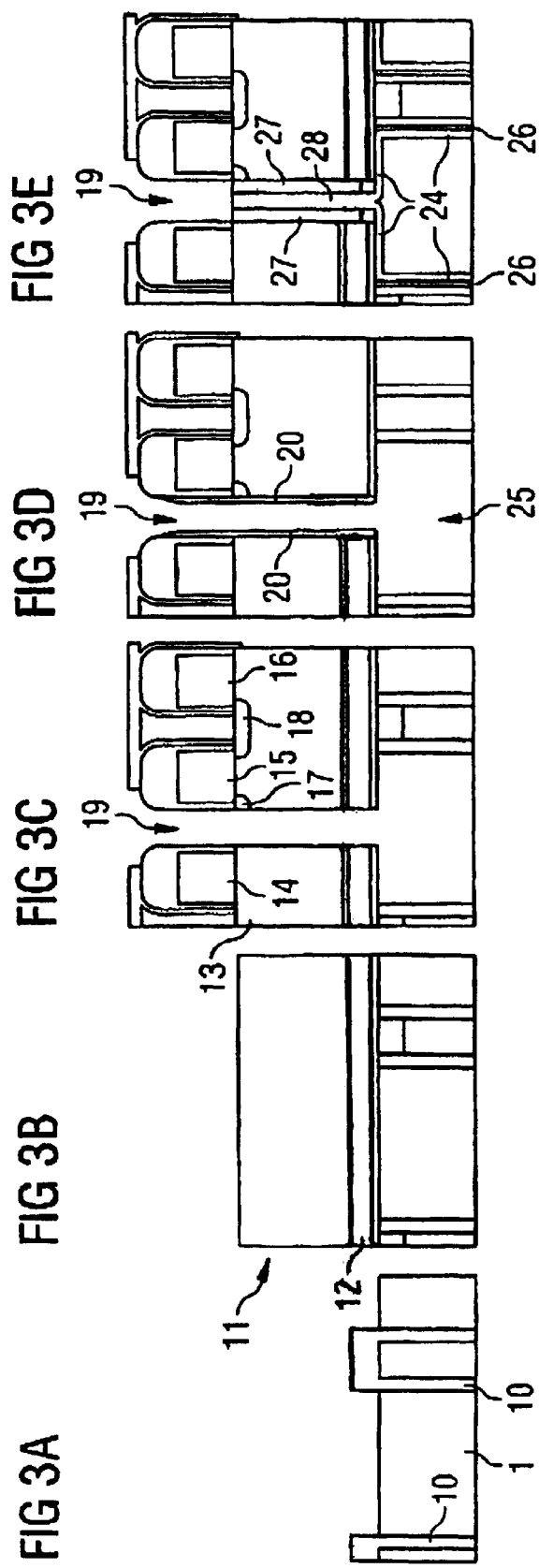

METHOD FOR PRODUCING A CAVITY IN A MONOCRYSTALLINE SILICON SUBSTRATE AND A SEMICONDUCTOR COMPONENT HAVING A CAVITY IN A MONOCRYSTALLINE SILICON SUBSTRATE WITH AN EPITAXIAL COVERING LAYER

BACKGROUND OF THE INVENTION

FIELD OF THE INVENTION

The invention lies in the semiconductor technology field. More specifically, the invention relates to a method for producing a cavity in a silicon substrate, such as a monocrystalline silicon substrate, wherein a cavity is incorporated in the silicon substrate and the wall of the cavity is covered by a covering layer at least in an upper end area. The invention also pertains to a semiconductor component having a cavity in a monocrystalline silicon substrate, which is covered by an epitaxial layer.

Semiconductor components such as DRAM memories are produced by a large number of technological method steps. In this case, it may be necessary to incorporate a cavity in a silicon substrate and then to fill the cavity for example with a layer sequence, in order to produce a trench capacitor. The trench capacitor is then conductively connected to a selection transistor in further production methods, with the selection transistor likewise being produced on the silicon substrate. This results in a memory cell for DRAM memory.

However, in other application areas (for example for microsystem technology) it is also necessary to incorporate cavities in a silicon substrate and to close the cavity. By way of example, pressure sensors are constructed in the form of cavities and are covered by a pressure membrane. The covered cavities represent either only an intermediate stage or a final stage in the production of a semiconductor component.

SUMMARY OF THE INVENTION

It is accordingly an object of the invention to provide a method for producing a cavity in a monocrystalline silicon substrate and a semiconductor component having a cavity in a monocrystalline silicon substrate with an epitaxial covering layer, which overrcomes the above-mentioned disadvantages of the heretofore-known devices and methods of this general type and which provides a simple method for producing a cavity in a silicon substrate and, furthermore, provides a semiconductor component having a cavity, with the cavity being covered by a covering layer which can be produced in a simple manner.

With the foregoing and other objects in view there is provided, in accordance with the invention, a production method for forming a covered cavity in a semiconductor substrate. The method comprises the following steps:

providing a monocrystalline silicon substrate having a silicon surface;

forming a cavity in the silicon substrate and covering walls of the cavity with a cover layer at least in an upper end region of the cavity;

depositing a covering layer on the silicon substrate with a selective epitaxial process; and thereby growing the covering layer substantially only on the silicon surface to cover the cavity with the covering layer and to form a covered cavity in the monocrystalline silicon substrate.

One advantage of the novel method is that a cavity which is incorporated into a silicon substrate is covered with an epitaxial covering layer using a simple method. To do this, a cover layer is applied to the wall of the cavity, and a covering layer is then applied to the substrate using a selective epitaxial deposition method. The method for producing the covering layer is chosen in such a way that the material to be deposited does not grow on the cover layer. The opening (which is arranged on the surface of the substrate) of the cavity is thus covered completely by the selective epitaxial deposition method. A cavity with an epitaxial covering layer is thus produced in a monocrystalline silicon substrate in one simple production process. In particular, the monocrystalline structure in this case also remains in the covering layer, so that transistors can be produced on the covering layer.

In accordance with another feature of the invention, the cover layer is spaced from the surface of the silicon substrate by a predetermined width.

In accordance with an added feature of the invention, a silicon dioxide layer is applied as the cover layer. The use of a silicon dioxide layer offers a simple and reliable technology for application of a cover layer, on which a silicon layer which is deposited using a selective epitaxial deposition method does not grow.

In accordance with an additional feature of the invention, the cavity is filled with a stop layer once the covering layer has been applied. The stop layer is formed in such a way that the stop layer is not removed by a selective wet-etching method. This allows a selective wet-etching method to be used in order to remove the cover layer in the upper edge area of the wall. This results in a further preferred embodiment for a simple production method.

A light-sensitive lacquer, a photoresist, is preferably used as the stop layer whose cost is low and which can easily be introduced into the cavity, and can be removed from the trench once again, preferably by way of a plasma etching process.

In accordance with a preferred embodiment of the invention, the novel method is used to introduce a trench for a trench capacitor into a silicon substrate, but with the trench being at least partially filled with a dielectric layer and an electrically conductive layer only after high-temperature steps have been carried out, and hence producing a trench capacitor. The trench capacitor is itself incorporated in the silicon substrate, in the form of a cavity with an epitaxial covering layer, before the high-temperature steps are carried out. It is thus possible to use materials for the production of the trench capacitor which do not withstand the high-temperature processes (as are normally used for the production of a memory module) without damage, but which have preferred characteristics for the operation of the trench capacitor.

It is preferably possible to use dielectric materials which have a high dielectric constant but are not stable at temperatures of more than 800° C. Furthermore, metallic layers can be used as electrical electrodes or conductors for making contact with the trench capacitor. Incorporation of the metallic layers after carrying out the high-temperature processes offers the advantage that the metallic layers are not subject to the high temperatures, which therefore do not adversely affect the electrical operation of the trench capacitor or of the silicon substrate.

Experiments have shown that, when the covering layer is formed in accordance with the described method, the covering layer grows into the cavity to a predetermined depth. This improves the stability of the covering layer. The covering layer is thus less sensitive to mechanical damage.

With the above and other objects in view there is also provided, in accordance with the invention, a semiconductor component, comprising:

a monocrystalline silicon substrate having a cavity with a wall formed therein;

a cover layer (e.g., silicon dioxide) covering the wall of the cavity at least in an upper edge area thereof; and an epitaxial layer (e.g., silicon) covering said cavity, said epitaxial layer projecting to a predetermined depth into said cavity, i.e., bulging into the cavity.

Other features which are considered as characteristic for the invention are set forth in the appended claims.

Although the invention is illustrated and described herein as embodied in a method for producing a cavity in a monocrystalline silicon substrate and a semiconductor component having a cavity in a monocrystalline silicon substrate with an epitaxial covering layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1A–1E are sectional views illustrating a first method for producing a cavity in a silicon substrate having an epitaxial covering layer according to the invention;

FIGS. 2A–2E are sectional views illustrating a second method for producing a cavity in a silicon substrate having an epitaxial covering layer, and FIGS. 3A–3E are sectional views illustrating a method for producing a memory cell for a DRAM memory.

DESCRIPTION OF THE PREFERRED EMBODIMENTS

Referring now to the figures of the drawing in detail and first, particularly, to FIG. 1A thereof, there is shown a silicon substrate 1 which is covered by a resin mask 2. An etching channel 3 is formed in the resin mask 2. The figure shows a cross section of the silicon substrate 1, the resin mask 2 and of the etching channel 3. In a subsequent method step, a cavity 4 is incorporated in the silicon substrate via the resin mask 2. The cavity 4 may have any desired shape. In the embodiment shown in FIG. 1B, it is in the form of a trench. An anisotropic etching method may be used, for example, for incorporation of the cavity 4.

In a further method step, in one preferred embodiment of the invention, a doping layer 5 is incorporated in the silicon substrate 1, adjoining the cavity 4. The doping layer 5 is produced, for example, by filling the cavity 4 with a glass layer that is doped with arsenic, and by subsequently using arsenic in a subsequent diffusion process in order to dope those areas of the silicon substrate which adjoin the cavity formed. This process stage is illustrated in FIG. 1B.

The resin mask 2 is then removed, and an oxidation method is used to apply a first cover layer 6, preferably in the form of an oxidation layer, to the wall of the cavity 4 and to the surface of the substrate 1. The first cover layer 6 may also be produced from a different material, with the major object of the first cover layer 6 being to ensure that no layer grows on the first cover layer 6 during a subsequent selective epitaxial deposition process. This process stage is illustrated in FIG. 1C.

The first cover layer 6 is then removed from the surface of the silicon substrate 1. In a further method step, the first cover layer 6 is then etched away in the edge area of the cavity 4. The etching process is carried out in such a way that the first cover layer 6 increases in thickness in the direction of the cavity 4, starting from the surface of the silicon substrate 1. In consequence, the surface of the cover layer 6 has a predetermined inclination angle 22 in the edge area. This process stage is illustrated in FIG. 1D. The use of a cover layer 6 which is chamfered in the edge area offers better characteristics for the growth of an epitaxial covering layer 7.

In a subsequent method step, an epitaxial silicon layer is applied to the silicon substrate 1, using a selective epitaxial deposition method. In this way, a covering layer 7 which also covers the opening area of the cavity 4 is produced on the surface of the silicon substrate 1. Owing to the selective epitaxial deposition method, the epitaxial silicon layer is deposited only on a silicon surface, so that no epitaxial silicon layer grows on the cover layer 6.

The epitaxial covering layer 7 is deposited, by way of example, using a CVD method wherein the epitaxial silicon layer is deposited from a mixture of dichlorosilene and HCL at a temperature of 900° C. The mixture that is used preferably comprises 180 sccm of dichlorosilene and 60 sccm of HCL.

The covering layer 7 is deposited with a concave curvature 21 into the cavity 4 during the selective epitaxial deposition process. The formation of the concave curvature 21 offers the advantage that the covering layer 7 is more mechanically robust. The cavity 4 is thus covered more reliably.

FIG. 2, with its partial views FIGS. 2A–2E, refers to a second method for producing a cavity 4 with a covering layer 7. FIG. 2A illustrates the process stage corresponding to FIG. 1C. The preceding steps have been carried out in accordance with the method steps shown in FIGS. 1A, 1B and 1C, with a cavity 4 having a cover layer 6 and preferably having a doping layer 5 preferably already having been incorporated into the silicon substrate 1. The cover layer 6 is also formed on the surface of the silicon substrate 1.

The stop material is particularly resistant to certain wet-chemical etching methods. This process stage is illustrated in FIG. 2B.

An etching method is then used to etch out the cover layer 6 in the edge area of the cavity 4 to a predetermined depth T, preferably using a wet-etching method, thus exposing the silicon substrate 1 in the edge area. The cover layer 6 is preferably removed by means of wet-chemical etching methods, to which the stop material 9 is resistant. Instead of an exposure lacquer, any other type of stop layer may also be used which is selective with regard to wet-chemical etching methods.

The stop material 9 is then removed from the cavity 4. If the stop material 9 is in the form of an exposure lacquer, the exposure lacquer is etched away by means of a plasma-chemical etching method. This method state is illustrated in FIG. 2. In a subsequent growth process step, the covering layer 7 is applied using the selective epitaxial deposition method. In the process, an epitaxial silicon layer 7 grows on the surface of the silicon substrate 1. Since one edge area 23 of the cavity 4 has a silicon surface, the epitaxial covering layer 7 also grows in this area. The more deeply arranged cover layer 6 prevents growth of the silicon layer, so that the cavity 4 remains essentially free of silicon material. However, owing to the chosen geometry, the covering layer 7 grows in a concave curvature area 21 in the direction of the cavity 4. This results in the formation of a covering layer 7, which is more mechanically robust over the cavity 4 and prevents the formation of crystal defects. The method that is used has thus been found to be advantageous for the mechanical robustness and electrical characteristics of the covering layer 7.

FIG. 3, with its partial views FIGS. 3A–3E, shows details of a method for producing a memory cell for a DRAM memory FIG. 3A shows a silicon substrate 2. which has doping layers 10. The trench 25 is bounded at the side by the doping layers 10, and a trench 25 is etched out of the silicon substrate. The doping layer 10 which overhangs the surface of the substrate 1 is then removed, and the trench 25 is covered by a epitaxial second silicon layer 11. The trench 25, together with the second silicon layer 11, represents a cavity which has been covered by an epitaxial layer according to the method shown in FIGS. 1 and 2. Adjacent to the silicon substrate 1, a second doping layer 12 is incorporated in the second silicon layer 11 using a doping method. This process stage is illustrated in FIG. 3B. An STI isolation layer 13, a first, a second, and a third word line 14, 15, 16 an a first and a second doping region 17, 18 are applied to or incorporated in the second silicon layer 11 in further method steps. Furthermore, a second etching channel 19 has been etched into the second silicon layer 11. This process stage is illustrated in FIG. 3C.

In a further method step, the side walls of the second etching channel 19 are covered with a second covering layer 20, which is preferably formed from silicon nitride. A trench 25 is then incorporated, using an etching method. The trench 25 is bounded at the side by the doping layers 10, and one trench 25 is etched out of the silicon substrate. This process stage is illustrated in FIG. 3D. The walls of the trench 25 are then covered with a dielectric layer 26 and with an electrically conductive layer 24. An isolation layer 27 is also incorporated into the second etching channel 19, in the form of an isolation collar. A second conductive layer 28 is formed within the isolation collar, conductively connecting the electrically conductive layer 24 of the trench capacitor to the first doping region 17. This process stage is illustrated in FIG. 3E.

The method according to the invention is used during the production of a DRAM memory cell in order to incorporate the trench 25 in the silicon substrate 1 and then to epitaxially grow the second silicon layer 11 as a covering layer. The details are not illustrated explicitly in FIG. 3 but can be found in FIGS. 1 and 2. The described method has the advantage that the trench 25 is formed without any filling during the high-temperature processes, during which the first and the second doping regions 17, 18 are incorporated in the second silicon layer 11 and the word lines 15, 16 are applied to the second silicon layer 11. As is illustrated in FIGS. 3C to 3E, once the high-temperature processes have been carried out, the trench capacitor is produced together with the dielectric layer and the electrically conductive layer as an electrode. This procedure offers the advantage that a temperature-sensitive layer with preferred characteristics for the operation of the trench capacitor can be used as the dielectric layer. Furthermore, a metal layer can be used as the electrically conductive layer, which is not subjected to any high-temperature processes by virtue of the procedure according to the invention. The metallic layer is thus also protected and, furthermore, there is no adverse effect on the operation of the memory cell resulting from the metal layer being subjected to a high temperature and producing disturbance effects.

We claim:

1. A production method, which comprises:

providing a monocrystalline silicon substrate having a silicon surface;

forming a cavity in the silicon substrate and covering walls of the cavity with a cover layer at least in an upper end region of the cavity;

depositing a covering layer on the silicon substrate with a selective epitaxial process; and thereby growing the covering layer substantially only on the silicon surface to cover the cavity with the covering layer and to form a covered cavity in the monocrystalline silicon substrate.

2. The method according to claim 1, wherein the cover layer is spaced from the surface of the silicon substrate by a predetermined width.

3. The method according to claim 1, wherein the cover layer is a silicon dioxide layer.

4. The method according to claim 1, which comprises spacing the cover layer from the silicon surface by:

filling the cavity with a stop layer;

subsequently selectively wet-etching to remove the cover layer from an upper edge area the walls of the cavity; and etching the stop layer out of the cavity.

5. The method according to claim 4, which comprises using an exposure lacquer as the stop layer.

6. The method according to claim 5, which comprises removing the exposure lacquer from the upper edge area of the wall by plasma etching after the cover layer has been etched away.

7. The method according to claim 1, wherein the cavity is a trench, and a doping layer is incorporated in the silicon substrate adjoining the trench, the doping layer representing a first electrode of a trench capacitor, and the method further comprising:

removing the covering layer;

at least partially covering the wall of the trench with a dielectric layer and at least partially covering the dielectric layer with an electrically conductive layer to form a second electrode of the trench capacitor.

8. The method according to claim 7, which comprises forming a memory cell with the trench capacitor, and incorporating components of a memory module into the silicon substrate.

9. The method according to claim 8, which comprises forming a DRAM memory module.

10. The method according to claim 7, which comprises forming a memory cell with the trench capacitor, and applying components or a memory module on the silicon substrate.

11. The method according to claim 10, which comprises forming a DRAM memory module.

\* \* \* \* \*